US005679604A

United States Patent [19]

Pikulski et al.

[11] Patent Number: 5,679,604

[45] Date of Patent: Oct. 21, 1997

[54] WIRE DIAMOND LATTICE STRUCTURE FOR PHASED ARRAY SIDE LOBE SUPPRESSION AND FABRICATION METHOD

[75] Inventors: Joseph L. Pikulski, Westlake; Juan F. Lam, Agoura Hills, both of Calif.

[73] Assignee: Hughes Aircraft Company, Los Angeles, Calif.

[21] Appl. No.: 725,148

[22] Filed: Oct. 2, 1996

Related U.S. Application Data

[62] Division of Ser. No. 416,625, Apr. 4, 1995, Pat. No. 5,614,919.

[51] Int. Cl.[6] .................... H01L 21/44

[52] U.S. Cl. .................... 437/188; 437/51; 437/209; 343/897; 343/909

[58] Field of Search .................... 437/188, 51, 203, 437/209; 343/909, 897

[56] References Cited

U.S. PATENT DOCUMENTS

| | | | |
|---|---|---|---|
| 3,148,370 | 9/1964 | Bowman . | |
| 3,961,333 | 6/1976 | Pulinton . | |
| 3,987,457 | 10/1976 | Moore . | |
| 4,089,734 | 5/1978 | Bierig | 437/189 |
| 4,479,131 | 10/1984 | Rogers et al. . | |
| 4,711,180 | 12/1987 | Brommer et al. . | |
| 4,812,854 | 3/1989 | Bonn et al. . | |
| 4,894,114 | 1/1990 | Nathanson et al. | 437/209 |
| 5,089,439 | 2/1992 | Lippey | 437/209 |
| 5,482,898 | 1/1996 | Marrs | 437/209 |
| 5,496,755 | 3/1996 | Bayraktaroglu | 437/51 |

FOREIGN PATENT DOCUMENTS

| | | |
|---|---|---|
| 59-28704 | 1/1984 | Japan . |
| 21 20 857 | 12/1983 | United Kingdom . |

OTHER PUBLICATIONS

K.M. Ho, C.T. Chan and C.M. Soukoulis, "Existence of photonic bandgap in periodic dielectric structures", Physical Review Letters, vol. 65, No. 2, 17 Dec. 1990, pp. 3152–3155.

*Primary Examiner*—Kevin Picardat
*Attorney, Agent, or Firm*—V. D. Duraiswamy; W. K. Denson-Low

[57] ABSTRACT

A diamond matrix metallic mesh suppresses RF energy, and particularly side lobe energy, in a phased array antenna, while passing main beam energy. The metal mesh emulates the structure of the bond segments joining the carbon atoms in a diamond structure. The wire diamond lattice structure is placed above an array of radiating elements to absorb side lobe energy. The wire lattice structure is fabricated through use of complementary forms which compress a wire into a required unit shape. Many unit shaped wires are placed in a form which hold the wires in the proper position. Other unit shaped wires are rotated 90 degrees and attached in place to the held wires. Additional unit shaped wires are added to form the basic interlocking cube structure of the diamond lattice.

6 Claims, 3 Drawing Sheets

FIG. 1.
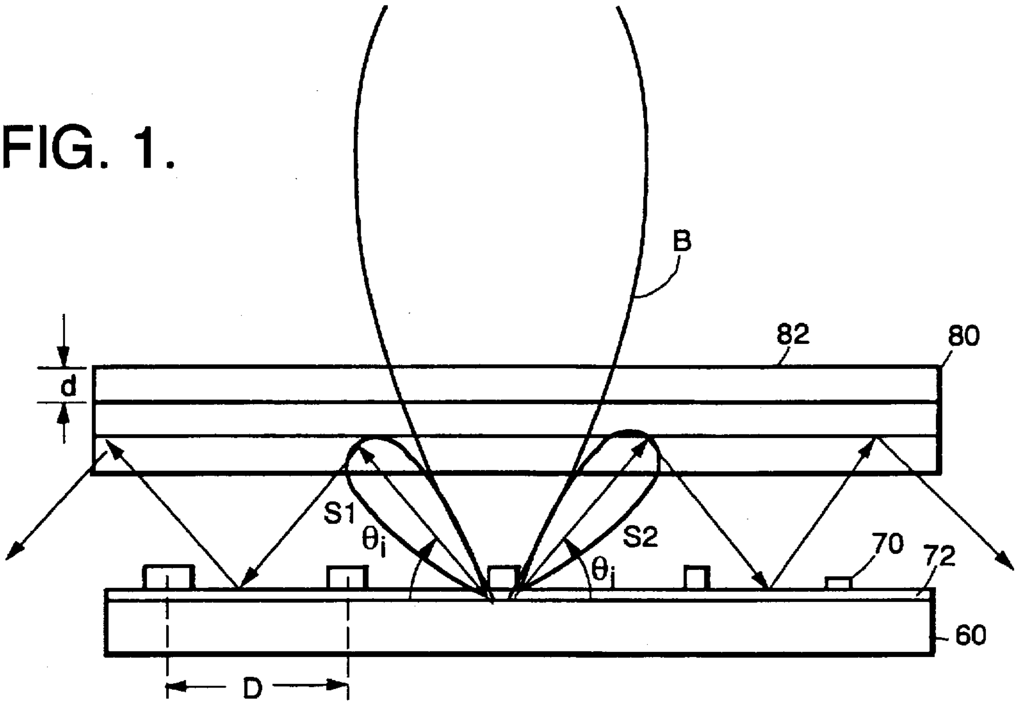
FIG. 2.
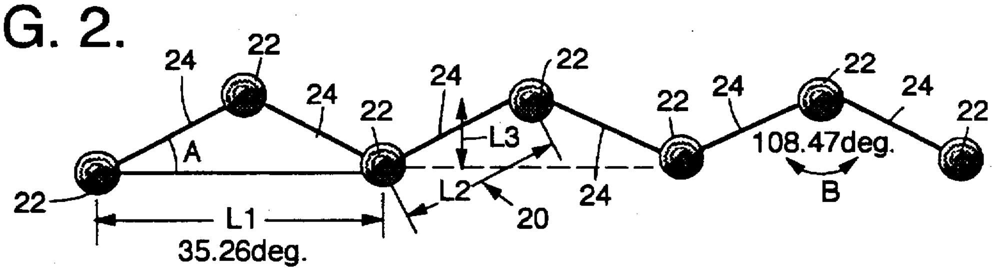
FIG. 3a.
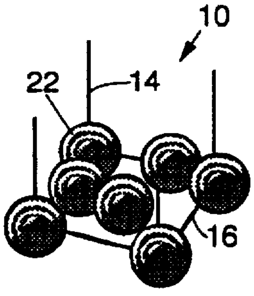
FIG. 3b.
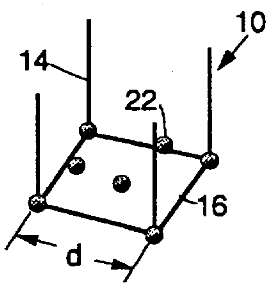
FIG. 3c.
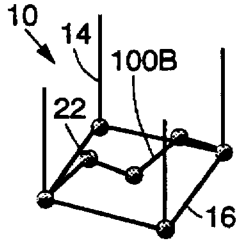
FIG. 3d.
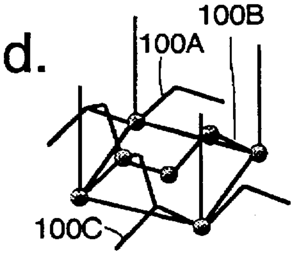
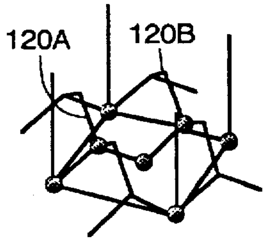
FIG. 3e.

WIRE DIAMOND LATTICE STRUCTURE FOR PHASED ARRAY SIDE LOBE SUPPRESSION AND FABRICATION METHOD

This is a division of application Ser. No. 08/416,625 filed Apr. 4, 1995 now U.S. Pat. No. 5,614,919.

TECHNICAL FIELD OF THE INVENTION

This invention relates to a diamond matrix metallic mesh structure which serves as a near perfect absorber of RF energy to suppress the side lobes produced from a phased array radar system, and to a method for fabricating the metallic mesh structure.

BACKGROUND OF THE INVENTION

Phased array radars are in use in many military and commercial applications. The transmit function of such phased arrays typically results in generation of side lobe radiation. There is a need to suppress such radiation, since it can occur over large angles and at high energy, allowing energy radars to triangulate and fix their fire control radars onto the radiator. Moreover, elimination of side lobes results in main beams having greater resolution, permitting target profiles/cross-sections to be calculated more efficiently and the system to refresh more quickly.

SUMMARY OF THE INVENTION

A structure is described for reflecting/absorbing electromagnetic radiation, comprising a wire mesh structure emulating a diamond lattice bond link structure between carbon atoms of a diamond lattice. The diamond wire lattice structure is useful for absorbing side lobe energy from a phased array radiating system.

A method for described for fabricating the wire mesh structure, comprising the following steps:

- fabricating a plurality of unit structure wire elements, each defining a zig-zag pattern of adjacent link portions, adjacent portions defining unit structure vertices;
- interconnecting said elements in adjacent tiers of unit structures, each tier defined by a set of spaced aligned unit structures, and wherein the structures of one tier are disposed transversely to the structures of adjacent tiers, and structures of one tier are electrically and mechanically interconnected to structures of adjacent tiers at said unit structure vertices.

The adjacent link portions of each unit structure preferably define an included angle of 108.47 degrees.

A preferred method for fabricating the unit structure elements comprises:

- providing a set of first and second forms, said forms defining complementary zig-zag surfaces in the outline of said unit structure elements;
- disposing said forms in an aligned, spaced relationship with said respective zig-zag surfaces facing each other;
- disposing a straight section of wire between said surfaces; and
- forcing said forms toward each other to compress said wire between said zig-zag surfaces, bending said wire to assume the shape of said zig-zag surfaces.

BRIEF DESCRIPTION OF THE DRAWING

These and other features and advantages of the present invention will become more apparent from the following detailed description of an exemplary embodiment thereof, as illustrated in the accompanying drawings, in which:

FIG. 1 is a simplified side view of an antenna array employing a wire diamond lattice structure in accordance with the invention for side lobe suppression.

FIG. 2 is a schematic diagram illustrating a basic element of a diamond lattice structure.

FIGS. 3A–3E are simplified diagrams illustrating the connection of a plurality of building block elements into a unit cube structure comprising a wire lattice structure in accordance with the invention. FIG. 3A shows one half of diamond lattice unit cube building block of a diamond structure. FIG. 3B is similar to FIG. 3A but with the size of the atom representations reduced in size. FIG. 3C illustrates the unit cube structure with one unit wire structure in place. FIG. 3D shows two additional unit wire structures arranged in alignment with the first unit wire structure. FIG. 3E shows fourth and fifth unit wire structures disposed transversely to the first three unit wire structures, with intersections between wire segment portions disposed at the center of carbon atoms in the unit cube.

DETAILED DESCRIPTION OF THE PREFERRED EMBODIMENT

Figure 4:
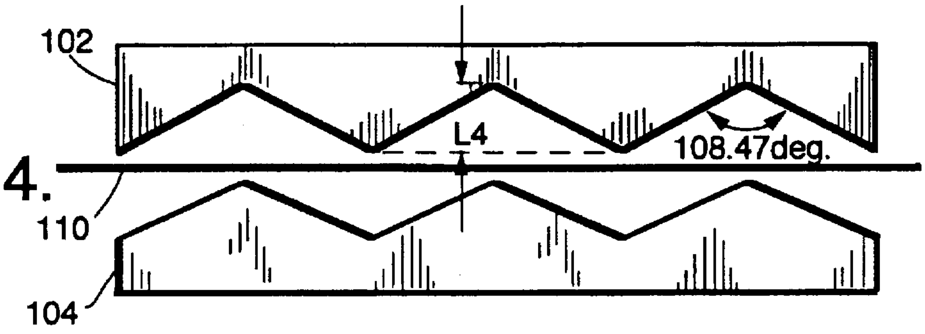
FIG. 4 illustrates complementary forms employed to compress a straight metal wire between complementary surfaces to form a wire unit structure element.

This invention is directed to a metal mesh matrix that has the structure of the bond segments joining the carbon atoms in the diamond structure. This structure will absorb and/or suppress the side lobe radiation that is generated by the radar transmitter in an active radar system. This radiation needs to be suppressed since it radiates at large angles and high energy, allowing the enemy radars to triangulate and fix their fire control systems onto this radiator. Moreover, the invention provides a technique to make a multi-functional aperture stealthy, since the sidelobes are suppressed. Since the side lobes are eliminated, the main beam has a greater resolution, and better target profiles/cross-sections can be calculated more efficiently and system refreshes more rapidly.

FIG. 1 is a simplified partially exploded schematic illustration of an exemplary embodiment of a phased array antenna 50 employing this invention. The system 50 includes a ground plane 60, which may be fabricated of a photonic band gap material as described in commonly assigned, co-pending application serial number 08/416,626, filed Apr. 04,1995, now U.S. Pat. No. 5,600,342, entitled "METHOD FOR PRODUCING A DIAMOND LATTICE VOID STRUCTURE FOR WIDEBAND ANTENNA SYSTEM," Attorney Docket PD 93240. Alternatively the ground plane can be a conventional metallic surface. The antenna includes an array of radiating elements 70 fabricated on a dielectric substrate 72, and having a periodicity D. In accordance with the invention, a side lobe energy absorbing/reflecting structure 80 extends above the plane of the radiating elements 70. The structure 80 is a diamond wire lattice structure.

In this exemplary embodiment of FIG. 1, the radiating elements 70 are stub elements comprising a stub element array. Five elements are shown in FIG. 1, of a three by five element array. These stub elements are fabricated on the substrate layer 72 fabricated, e.g., of Duroid (TM).

The ground plane 60 below the radiators 70 reflects all of the incident radiated power from the radiators. The function of the structure 80 is to reflect/absorb the undesirable side lobe energy, so that the undesirable sidelobe energy is essentially trapped and prevented from radiating to free space, while allowing the main beam energy to pass through the structure.

For the case in which the ground plane 60 is a photonic band gap material, there is no particular spacing requirement for a given space dimension between the radiating plane of the radiating elements 70 and the ground plane 60, except for some irregularity appearing from surface waves. For the case in which the ground plane is a conventional metallic plane, then the distance between the radiating plane and the ground plane should be one quarter wavelength of radiation for monochromatic radiation.

The ideal spacing between the radiating plane of the radiating elements 70 and the side lobe energy absorbing structure 80 is zero, although there is no electrical contact between the wires comprising the structure 80 and the radiators 70.

FIG. 1 also illustrates a simple radar emission from the antenna array comprising the radiating elements 70, with two sidelobes S1 and S2 surrounding a main beam B, and radiating into a metal mesh matrix. The Bragg reflected wave condition is given by $$\sin\theta=\lambda/2d$$

where $\lambda 0$ is the radiation wavelength, d is the unit lattice dimension inside the metal mesh matrix, and $\theta$ is the angle of side lobe emission. Hence, for a specific sidelobe angle, say $\theta_i$, and wavelength of emission, the lattice dimension $d_i$ for the metal mesh is specified. Given that these values satisfy the Bragg reflected wave condition, no sidelobe radiation at angle $\theta_i$ is transmitted through the metal mesh. Since the metal mesh is already fabricated to satisfy the sidelobe suppression at the sidelobe angle $\theta_i$, the main lobe B, at $\theta$=90 degrees, does not satisfy the Bragg condition. Thus, the main lobe B is transmitted through the metal mesh structure 80, albeit with some losses incurred.

The sidelobes S1 and S2 will appear at an angle $\theta=\lambda/D$, where D is the period of the antenna array. Hence the lattice dimension d in the metal mesh 80 is related to the array periodicity by D=2d for a specific radiation wavelength.

The basic building blocks of the metal mesh diamond structure for the wire absorber 80 emulate the bond lines that lie parallel/perpendicular to the {1,1,0} planes of the diamond lattice. These bond lines form a zig-zag structure 20 as shown in FIG. 2, wherein the bond lines 24 interconnect between carbon atoms 22. As shown in FIG. 2, angle A is 36.26 degrees, and angle B, the included angle formed between adjacent links 24, is 109.47 degrees. The outline of the zig-zag structure 20 will form the basic unit structure employed in fabricating an embodiment of the wire mesh lattice structure 80.

In an exemplary embodiment, the basic unit zig-zag structure 100 is formed from a straight length of metal wire 110 of the appropriate gauge or diameter chosen for the desired frequency of operation. The wire gauge or diameter is not critical, and is typically selected to produce a needed structural strength. In one exemplary embodiment, the wire gauge is selected to be about 1/10 (or smaller) of the unit diamond lattice dimension d (FIG. 3B).

FIGS. 3A–3E illustrate the connection of a plurality of the unit structures 100 into the structure 80. FIG. 3A shows one half of diamond lattice unit cube building block 10. The spherical balls 22 represent one half of the carbon atoms in the diamond cube structure. Vertical and horizontal sticks 14 and 16 indicate the sides and bottom of the unit cube. FIG. 3B is similar to FIG. 3A but with the size of the atoms reduced to show the side and bottom sticks 14 and 16 more clearly.

FIGS. 3C–3E illustrate the buildup of a wire lattice structure in accordance with the invention. FIG. 3C illustrates the unit cube structure 10 with one unit wire structure 100B in place, essentially running diagonally across the unit cube structure, with intersections between wire segment portions disposed at the center of carbon atoms in the unit cube. Next, at FIG. 3D, two additional unit wire structures 100A and 100C are arranged in alignment with the first unit wire structure 100B. These second and third unit wire structures will interconnect this unit cube structure 10 to adjacent unit cube structures. FIG. 3E shows fourth and fifth unit wire structures 120A and 120B disposed transversely to the first three unit wire structures 100A–100C, with intersections between wire segment portions disposed at the center of carbon atoms in the unit cube. To complete the unit cube structure 10, third and fourth tiers or courses of wire structures would be added, in the same manner.

Figure 5:
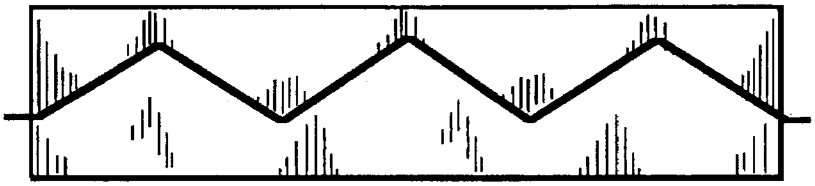
FIG. 5 shows the two forms of FIG. 4 in compression against a metal wire to bend the wire into the zig-zag shape of the unit structure element.

To produce the basic unit zig-zag wire structure according to an exemplary fabrication method, complementary forms 102 and 104 are constructed as shown in FIG. 4. As shown in FIG. 4, the metal wire 110 is positioned between the complementary surfaces of the forms 102 and 104. When the straight length of metal wire 110 is compressed between the forms 102 and 104, as shown in FIG. 5, the straight wire is transformed into the required shape of the basic unit structure 100.

Figure 6:
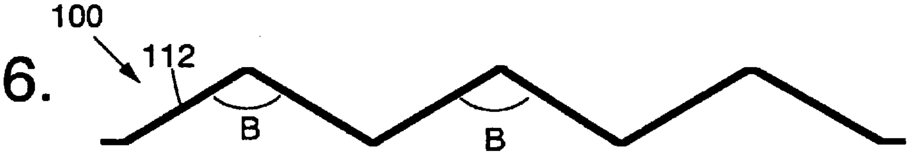
FIG. 6 shows an exemplary wire unit structure in isolation.

The basic unit structure 100 is shown in FIG. 6. As in the diamond bond link structure of FIG. 2, the adjacent "links" of the structure 100, i.e., the adjacent straight segments 112 of the wire forming the structure, meet at an included angle of 109.47 degrees. Several of the unit structures 100 can be made simultaneously using the forms 102 and 104. Moreover, only this set of forms 102 and 104 is required to produce the complete diamond metal mesh structure 80.

Figure 7:
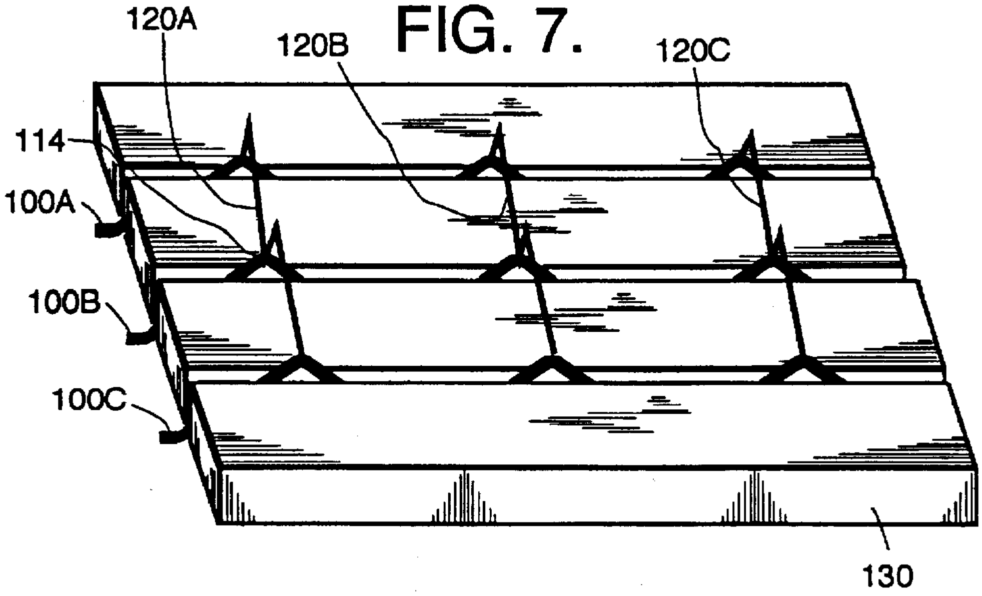
FIG. 7 illustrates an exemplary initial step in a fabrication process to fabricate a diamond wire lattice structure embodying the invention, wherein tines of a fork structure position unit structure elements in an aligned relationship for attachment to a second tier of unit structures.

Once the basic unit structures 100 have been made up as shown in FIG. 6, many of the structures are assembled to form the wire mesh structure 80. Referring to FIG. 7, a metal fork structure 130 is employed to hold a first tier of the unit structures in place for assembly with a second tier of unit structures. The fork structure 130 includes a number of fork tines 132, 134, 136 and 138. The fork structure may include many more tines; only four tines are shown for simplicity in FIG. 7. The tines are made from flat strips of metal, and act as gauge blocks to hold the first tier of metal wire unit structures 100A, 100B and 100C in the exact position required for connection of the first tier to a second tier of unit structures 120A, 120B and 120C. The second tier of unit structures 120A–120C is rotated 90 degrees relative to the first tier of structures 100A–100C. The first and second tiers are connected both electrically and mechanically at upper vertices 114 of the unit structures. The connection at the vertices is by soldering, brazing, laser welding or electroforming, or by other known method of connecting metal structures electrically and mechanically. Once the first and second tiers are connected, the tines of the fork are removed from the resulting structure, and the diamond structure begins to emerge, as shown in FIG. 8.

Figure 8:
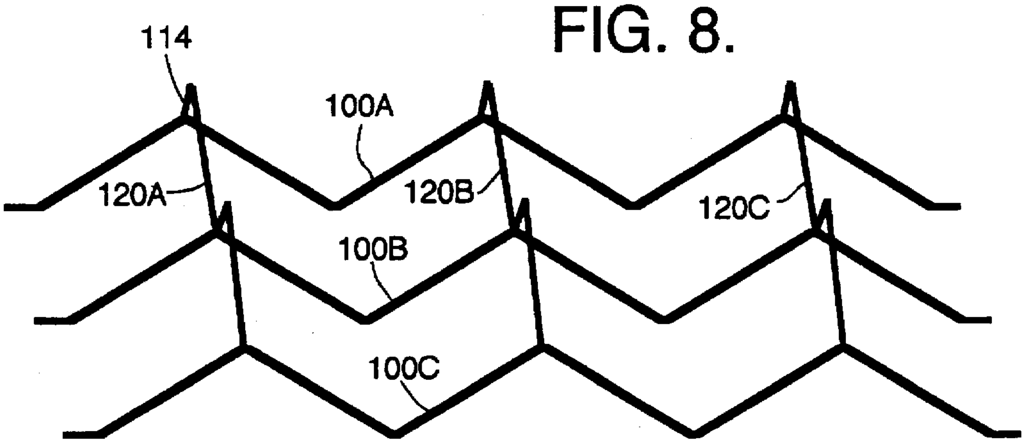
FIG. 8 shows the resulting partial assembly resulting from the assembly step of FIG. 7.
Figure 9:
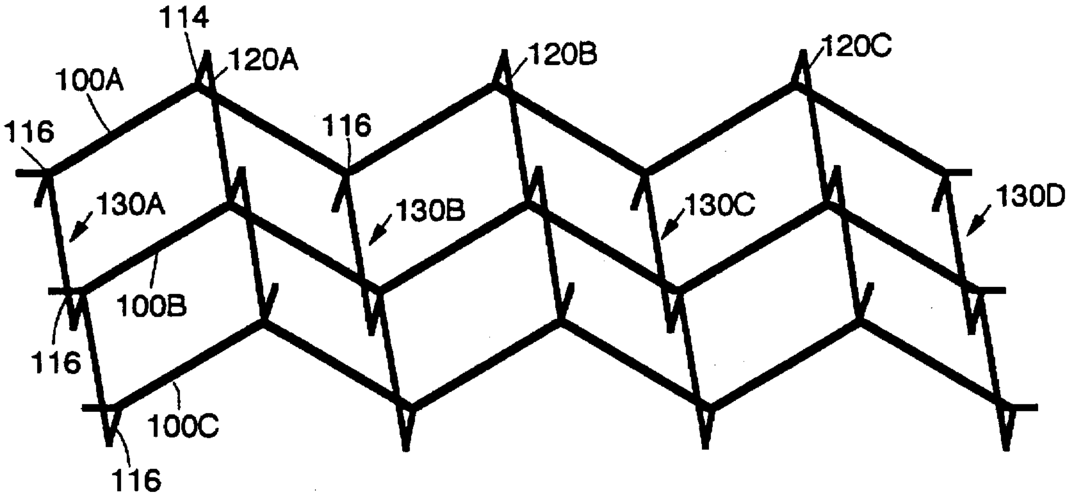
FIG. 9 shows a further step in the assembly of the wire lattice structure, wherein a third tier of unit structure elements has been added to the partial assembly of FIG. 7.

Referring now to FIG. 9, a third tier of unit structures 130A–130D is added to the partial assembly of FIG. 8. The structures of the third tier are attached at the lower set of vertices 116 of the first tier structures 100A–100C. The third tier unit structures are also oriented at 90 degrees relative to the first tier structures.

Figure 10:
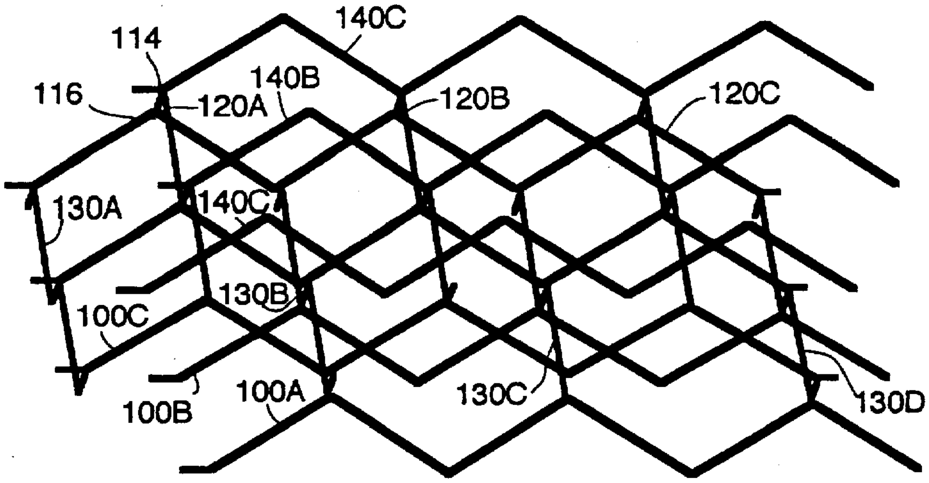
FIG. 10 shows a further step in the assembly of the wire lattice structure, wherein a fourth tier of unit structure elements has been added to the partial assembly of FIG. 8, resulting in a basic interlocking cube structure of the diamond lattice structure.

In the next fabrication step, the result of which is shown in FIG. 10, a fourth tier of unit structures is added to the partial assembly of FIG. 9. The fourth tier structures 140A–140C are oriented parallel to the first tier structures, and orthogonally to the second and third tier structures. The fourth tier structures are attached at their respective lower vertices to corresponding upper vertices 116 of the second tier unit structures 120A–120C. The assembly shown in FIG. 10 illustrates the basic interlocking cube structure of the diamond lattice structure.

If the lattice dimension d of the diamond cube is approximately 1.0 centimeter, then the distances of the unit structures 10 become the following for a center frequency of approximately 14.7 GHz.

L1=0.71 cm,
L2=0.43 cm,
L3=0.25 cm, and
L4=0.25 cm.

where L1, L2, L3 and L4 are as shown in FIG. 2 and FIG. 3. All of these dimensions are such that machining of the forms and performing the interconnecting of the unit structures are all very manageable. Table I below relates the dimensions of the unit shape 100 to the center frequency of the radar system.

TABLE I

| L1 (cm) | d (cm) | Center Freq (GHz) | Bandpass (GHZ) |
|---|---|---|---|
| .7068 | 1.02 | 14.7 | 6.76 |
| 1.1238 | 1.59 | 9.4 | 4.32 |
| 1.795 | 2.54 | 5.9 | 2.71 |
| 2.8625 | 4.05 | 3.7 | 1.7 |
| 4.5942 | 6.5 | 2.3 | 1.06 |

The values given in Table I are derived in the following manner. The center frequency f is determined by the dimension d of the lattice through the relationship $$f=c/2d$$

where c is the speed of light. The dimension d is also equal to $\lambda/2$, where $\lambda$ is the wavelength at the center frequency f. The bandpass is determined from published data on diamond wire lattices, which gives an optimum bandpass as a function of the lattice spacing and ratio of air to metal. See, e.g., K.M. Ho, C. T. Chan and C. M. Soukoulis, "Existence of photonic bandgap in periodic dielectric structures," Physical Review Letters, 65, 3152 (1990).

The wire lattice structure 80 should be oriented such that the planes of symmetry of the lattice structure face the radiating elements 70, i.e., the Bragg condition for reflected waves. The planes of symmetry are indicated as planes 82 in FIG. 1, and are spaced apart by the unit lattice dimension d. The planes are defined by the bottom and top planes of the unit cube structures 10 which make up the wire lattice structure 80.

It is understood that the above-described embodiments are merely illustrative of the possible specific embodiments which may represent principles of the present invention. Other arrangements may readily be devised in accordance with these principles by those skilled in the art without departing from the scope and spirit of the invention.

What is claimed is:

1. A method for fabricating a wire mesh structure emulating a diamond lattice structure, comprising the following steps:

fabricating a plurality of unit structure wire elements, each defining a zig-zag pattern of adjacent link portions, adjacent portions defining unit structure vertices;

interconnecting said elements in adjacent tiers of unit structures, each tier defined by a set of spaced aligned unit structures, and wherein the structures of one tier are disposed transversely to the structures of adjacent tiers, and structures of one tier are electrically and mechanically interconnected to structures of adjacent tiers at said unit structure vertices.

2. The method of claim 1 wherein said adjacent link portions of each unit structure define an included angle of 108.47 degrees.

3. The method of claim 1 wherein said step of fabricating said unit structure elements comprises:

providing a set of first and second forms, said forms defining complementary zig-zag surfaces in the outline of said unit structure elements;

disposing said forms in an aligned, spaced relationship with said respective zig-zag surfaces facing each other;

disposing a straight section of conductive wire between said surfaces; and forcing said forms toward each other to compress said wire between said zig-zag surfaces, bending said wire to assume the shape of said zig-zag surfaces.

4. The method of claim 1 wherein said interconnecting of structures of one tier to structures of adjacent tiers at said unit structure vertices is by soldering.

5. The method of claim 1 wherein said interconnecting of structures of one tier to structures of adjacent tiers at said unit structure vertices is by brazing.

6. The method of claim 1 wherein said interconnecting of structures of one tier to structures of adjacent tiers at said unit structure vertices is by laser welding.

* * * * *